United States Patent [19]

Wuu et al.

[11] Patent Number: 5,480,814
[45] Date of Patent: Jan. 2, 1996

[54] PROCESS OF MAKING A POLYSILICON BARRIER LAYER IN A SELF-ALIGNED CONTACT MODULE

[75] Inventors: Shou-Gwo Wuu, Chu-Gong Hsinchu; Mong-Song Liang, Hsin-chu; Chuan-Jung Wang, Chu-Tong; Chung-Hui Su, Hsinchu, all of Taiwan

[73] Assignee: Taiwan Semiconductor Manufacturing Co., Ltd., Hsin-Chu, Taiwan

[21] Appl. No.: 365,049

[22] Filed: Dec. 27, 1994

[51] Int. Cl.⁶ .................... H01L 21/265; H01L 21/70; H01L 27/00; H01L 21/44

[52] U.S. Cl. ................ 437/41; 437/52; 437/190; 437/193

[58] Field of Search ............... 437/41, 52, 189, 437/190, 193, 200, 203, 41 GS, 41 SM

[56] References Cited

U.S. PATENT DOCUMENTS

| | | | |
|---|---|---|---|
| 4,800,177 | 1/1989 | Nakamae | 437/200 |
| 4,904,620 | 2/1990 | Schmitz | 437/200 |
| 4,985,371 | 1/1991 | Rana et al. | 437/189 |
| 5,174,858 | 12/1992 | Yamamoto et al. | 437/189 |
| 5,275,972 | 1/1994 | Ogawa et al. | 437/195 |

Primary Examiner—George Fourson
Assistant Examiner—Brian K. Dutton
Attorney, Agent, or Firm—George O. Saile; William Stoffel

[57] ABSTRACT

A method for forming a metal contact in a self aligned contact region over a impurity region in a substrate which comprises forming a doped polysilicon layer over the device surface except in a contact area. A thin polysilicon barrier layer and a metal layer, preferably tungsten, are then formed over the polysilicon layer and the contact area. The resulting metal contact has superior step coverage, lower resistivity, and maintains the shallow junction depth of buried impurity regions.

21 Claims, 4 Drawing Sheets

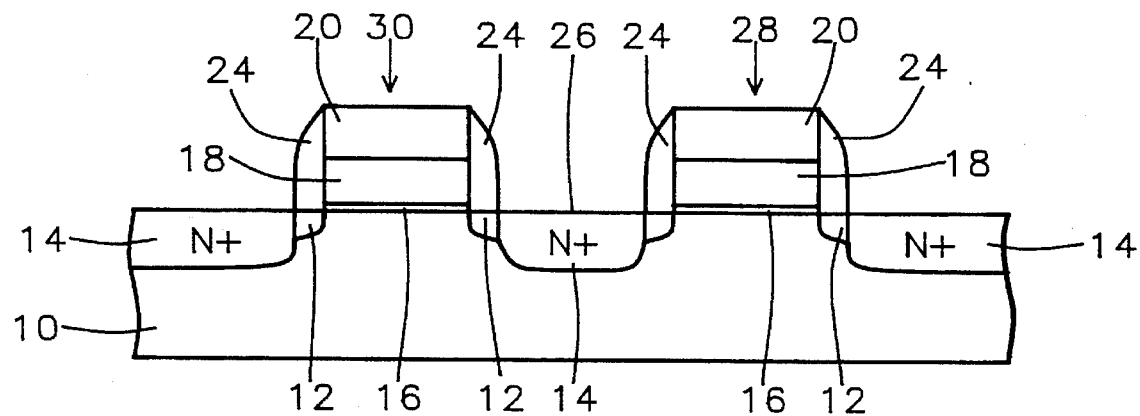
FIG. 1 – Prior Art
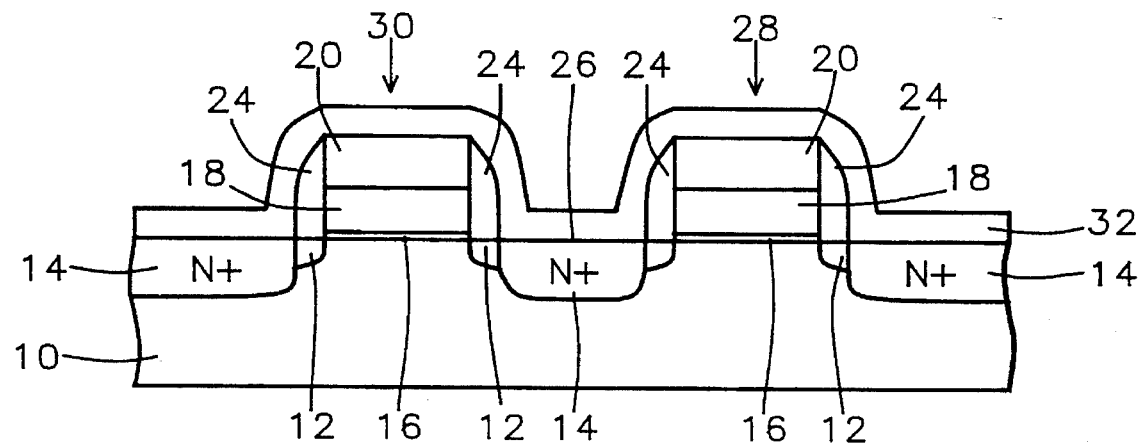
FIG. 2 – Prior Art
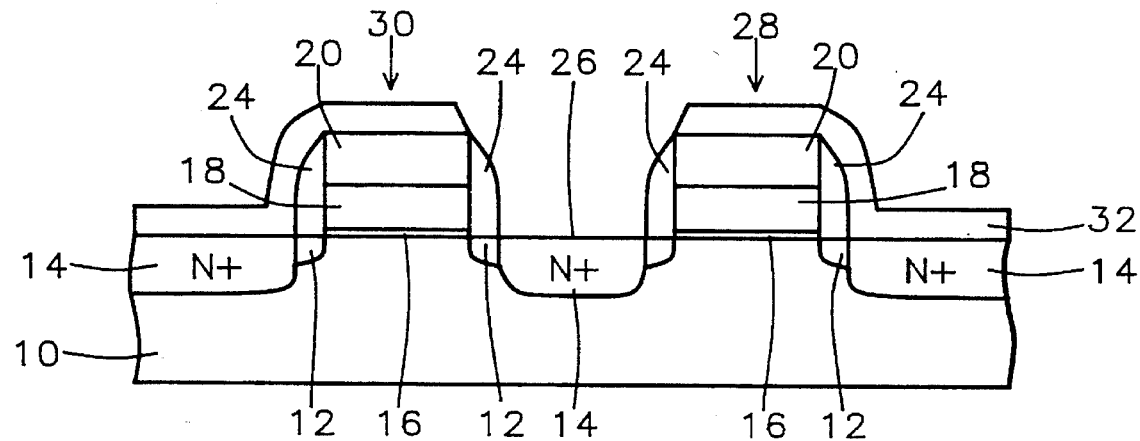
FIG. 3 – Prior Art

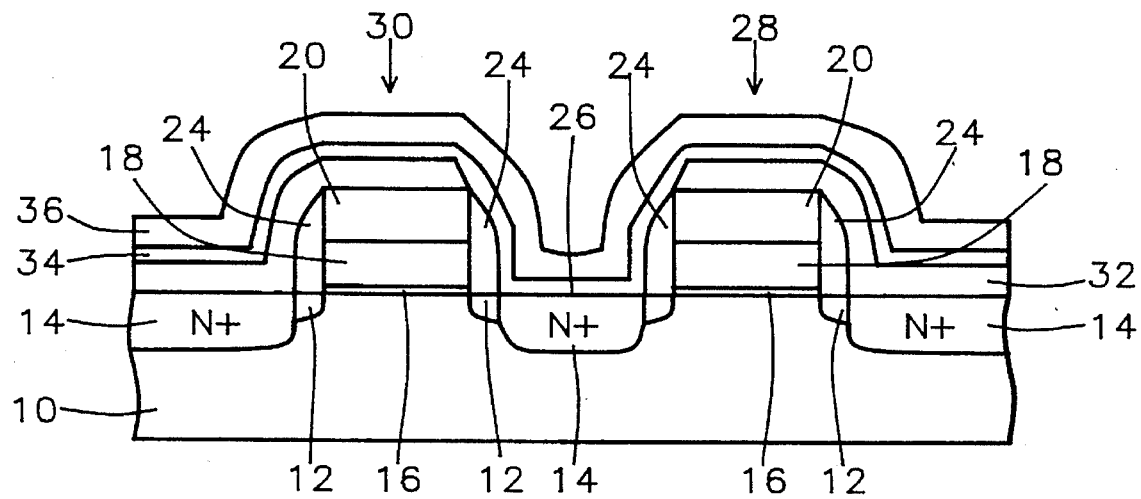
FIG. 4 – Prior Art
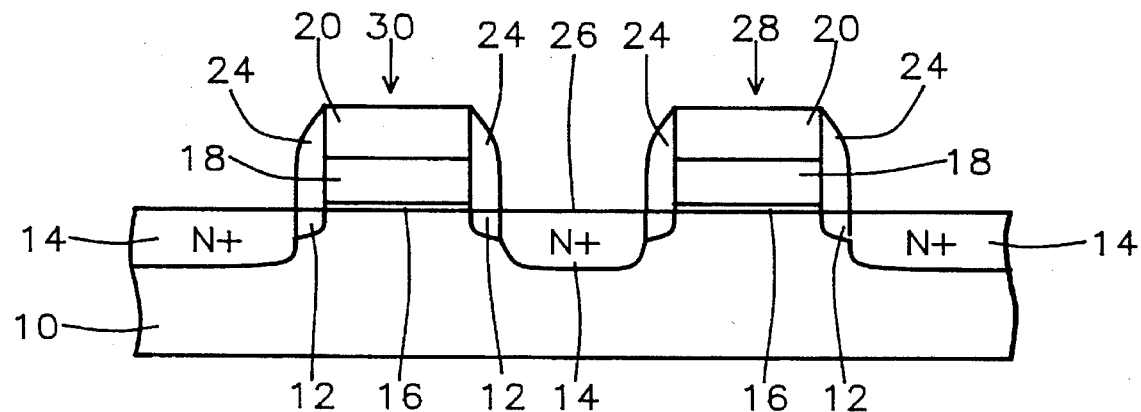
FIG. 5
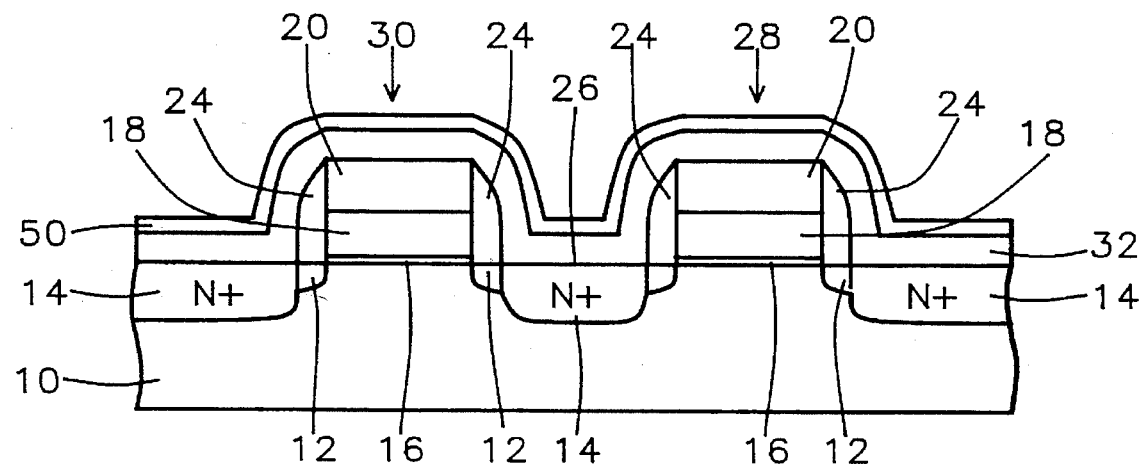
FIG. 6

PROCESS OF MAKING A POLYSILICON BARRIER LAYER IN A SELF-ALIGNED CONTACT MODULE

BACKGROUND OF INVENTION

1) Field of the Invention

This invention relates to a method of manufacturing semiconductor devices comprising a metal layer.

2) Description of the Prior Art

In semiconductor integrate circuit manufacturing, metals are formed into patterned layers to make electrical connections to and between individual devices on a silicon substrate, such as sources, drains, and gates of field effect transistors (FET's). Metal maybe deposited over the substrate, dielectric layers and other structures, such as gate structures. In the simplest method, a free surface is blanketed with metal and the deposited metal is then patterned to form the desired interconnection configuration. In the current semiconductor process, aluminum is the most widely used material; but other refractory materials are being used, tungsten in particular. Blanket layers of metal can be deposited by low pressure chemical vapor deposition (LPCVD) and the patterning of metal layers can be accomplished by conventional lithographic and etching (plasma or sputter) etching techniques.

To form more accurate contacts between buried devices in the substrate, such as source and drain impurity regions, a method of forming self aligned contacts (SAC) is often used. A self aligned contact is formed by patterning layers or structures around a contact area so that when a metal layer is formed over the structures and the contact region, the metal forms an electrical connection with the impurity regions in the substrate, e.g. a source or drain region. However, self aligned contacts often suffer from several problems, such as poor metal contact with the substrate because of poor "step coverage" over the underlying structures, e.g., over oxide sidewall spacers. Also, when metal is formed directly on the substrate surface, the metal consumes a portion of the substrate causing the underlying source or drain junction to be formed deeper in the substrate.

A conventional process for forming a self aligned contact with a metal layer is shown in FIGS. 1 through 4. As shown in FIG. 1, gate structures 28, 30 are formed on a semiconductor substrate 10 using conventional processes which are commonly known to those skilled in the art. Therefore only the elements will be described, not the processes. The gate structures 28, 30 are comprised of: gate oxide layer 16, gate 18, top oxide layer 20 (also referred to as self aligned contact oxide layer), oxide sidewalls spacers 24. The substrate 10 has two silicon substrate diffusions, a N– diffusion (referred to as a lightly doped source or drain) 12 and a N+ diffusion (referred to as a heavily doped source or drain) 14.

Referring to FIG. 2, a inter-poly oxide layer 32 is formed on the device surface. The term "device surface" is used herein to include all layers and structures formed on the substrate. Next, portions of the inter-poly oxide layer 32 between the gate structures 28, 30 are etched (called a self-aligned contact etch) to expose the oxide sidewalls 24 and the contact area 26 as illustrated in FIG. 3.

Subsequently, a polysilicon layer 34 is formed with a thickness in the range of 500 to 600 Å on the device surface as illustrated in FIG. 4. The polysilicon layer 34 then implanted with impurity ions to increase its conductivity. Polysilicon layer 34 is deposited between the metal layer 36 and the oxide layers 24, 32 to prevent the pealing of the metal layer 36 from the device surface. A metal layer 36, preferably tungsten silicide, is formed over the polysilicon layer 34. The tungsten silicide layer 36 forms an electrical connection with the substrate and the underlying source/drain region 12, 14 in the contact area 26. This process is self aligning since the tungsten silicide connections/contacts 26 to the source/drain diffusion 12 14 are defined using the oxide sidewall spacers 24 as the mask. This self aligning contact process eliminates less precise and more costly lithography process steps.

However, the conventional self align contact process has several drawbacks. First, the source/drain junctions are driven deeper into the substrate because additional impurity ions from the heavily doped N+ polysilicon layer are driven into the source/drain regions during subsequent heat processing, such as the contact flow process at about 900 C°. The deeper source/drain junction depth can induce a large leakage current and device punchthrough.

In addition, with the conventional process, the contact resistance will increase in small contact areas because the step coverage of the metal 36 (tungsten silicide) is poor. The thickness of inter-poly silicon takes up surface area which could be used to form metal contact areas thus the inter-poly layer effectively decreases the contact opening area. Also, tungsten silicide is difficult to deposit within small contact areas and to establish an electrical connection between the silicide and the source/drain.

U.S. Pat. No. 4,985,371 to Rana et al., teaches a method to produce thick highly conductive metal layers having small grain sizes so that the grain size will not prevent the metal layer from being formed into accurate small patterns. The method comprises forming a series of alternating layers of metal and "metal grain-growth interrupting material." Where tungsten is the metal, silicon is the preferred grain-growth interrupting material.

U.S. Pat. No. 4,904,620 to Schmitz teaches a method of forming titanium disilicide layers where a series of alternating layers of titanium and silicon are deposited on a substrate. The layers are heat treated to form a titanium disilicide layer.

SUMMARY OF THE INVENTION

It is an object of the present invention to provide a method of forming a self aligned contact with a metal silicide having good step coverage.

It is a further object of the present invention to provide a method of forming a self aligned contact of a tungsten silicide where the underlying source/drain regions have shallow junction depths.

It is yet another object of the present invention to provide a method of forming a metal self aligned contact which prevents metal peeling from the self alignment structure sidewalls and which has a low contact resistance between the metal contact layer and the substrate.

It is still yet another object of the present invention to provide a method to minimize the amount of sidewall oxide etched prior to the tungsten silicide deposition.

In accordance with the above objectives, a process for forming a integrated circuit device having a self aligned contact with a metal silicide such as TiSi2, TaSi$_2$, CoSi$_2$, NiSi$_2$, and PtSi$_2$, is provided.

Two gate structures are formed on a semiconductor substrate with a self aligned contact area between two gate structures. Each gate structure comprises a first gate oxide formed on the substrate; a polysilicon gate formed on the gate oxide; an top oxide formed on the polysilicon gate; and sidewalls spacers formed on the sidewalls of the gate oxide, polysilicon gate, and top oxide. Next, an inter-poly oxide layer is formed on the substrate and gate structures. A polysilicon layer is then formed over the inter-poly oxide layer and impurity ions are implanted into the polysilicon layer. Portions of the inter-poly oxide layer and polysilicon layer in the area between the gate structures are removed thus exposing the sidewall spacers and the contact area. A barrier layer is deposited over the polysilicon layer, the sidewall spacers, and the contact area. Subsequently, a layer of tungsten silicide is deposited over the barrier layer thereby forming an electrical connection between the polysilicon layer and the substrate in the self aligned contact area. Lastly, the first metal layer is patterned and passivation and additional metal layers are formed over of the first metal silicide layer and gate structures thereby completing the integrated circuit device.

BRIEF DESCRIPTION OF THE DRAWINGS

The drawings show the following:

FIGS. 1 through 4 show the conventional process for forming a self aligned metal contact.

FIGS. 5 through 8 show the process of the present invention for forming a self aligned metal contact.

DETAILED DESCRIPTION OF THE PREFERRED EMBODIMENTS

Figure 7:
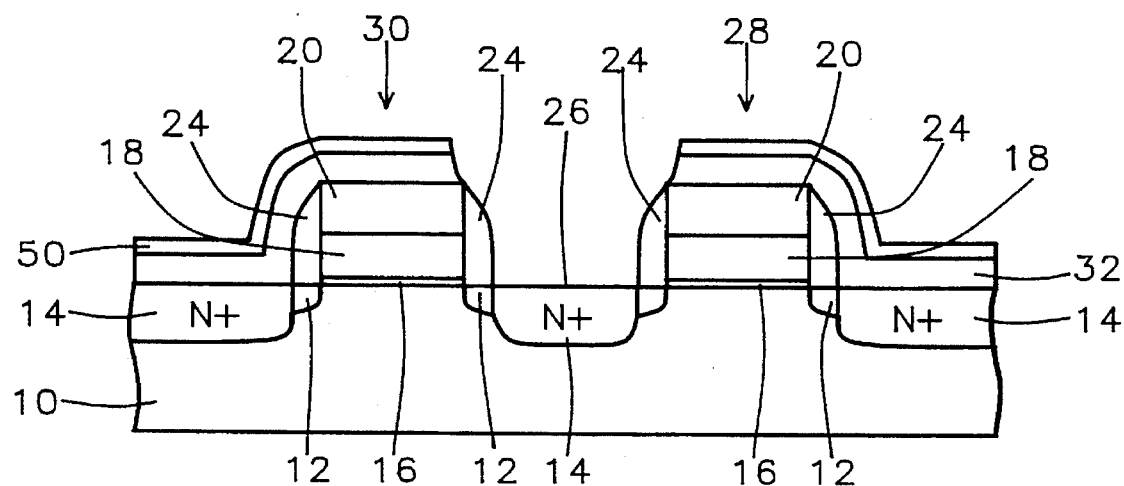

The present invention will be described in detail with reference to the accompanying drawings. It should be noted that the drawings are in greatly simplified form. In practice the semiconductor device structure will be one of many supported on a common substrate connected with suitable metallurgy in various electronic electric circuit configurations. The substrate 10 shall be a monocrystalline silicon semiconductor body with many devices fabricated therein, as is well known in the art. The substrate 10 is preferably formed of monocrystalline silicon preferably having a crystalline orientation of <100>. The background substrate dopant is of first conductivity type, and preferably P-type, preferably with boron impurity with a concentration in the range of 5E15 to 5E17 atoms/cm$^3$.

According to the present process, as shown in FIG. 5, gate structures 28, 30 are formed on a semiconductor substrate 10 using conventional processes. Also, opposite conductivity type devices can be formed in wells in the substrate as is well known in the art. A gate oxide layer 16 is formed on substrate 10. The gate structures 28, 30 are comprised of: gate oxide layer 16, gate 18, top oxide 20 (also referred to as self aligned contact oxide), and sidewall spacers 24.

Gate oxide layer 16 has a thickness in the range of 60 to 200 Å. Gate 18 has a thickness in the range of 1000 and 3500 Å. Gate 18 can be doped with Phosphorous to form a N+ gate to a concentration in the range of 1E18 to 1E21 atoms/cm$^3$. The top oxide 20 has a thickness in the range of 1000 to 3500 Å. The sidewalls spacers 24 are preferably formed of silicon oxide and have a thickness in the range of 1000 to 2500 Å. The substrate 10 has different two diffusions, a N– diffusion (referred to as a lightly doped source or drain) 12 and a N+ diffusion (referred to as a heavily doped source or drain) 14. The lightly doped source/drain 12 has a concentration in the range of 1E17 to 1E19 atoms/cm$^3$. The heavily doped source/drain has a concentration in the range of 1E18 to 1E21 atoms/cm$^3$.

Subsequently a inter-poly oxide layer 32 is formed on the device surface. Inter-poly oxide layer 32 can be formed by conventional wet or dry thermal growth processes or low pressure chemical vapor deposition (LPCVD). For example, inter-poly oxide layer 32 can be grown at atmospheric pressure at 700° to 1200° C. in a wet ambient in a thermal furnace. Inter-poly oxide layer 32 can have a thickness in the range of 700 to 2000 Å.

A polysilicon layer 50 is deposited over the Inter-poly oxide layer 32. Polysilicon layer 50 can be formed by a conventional LPCVD process. The polysilicon layer 50 can be deposited by prolysing silane in a low pressure chemical vapor deposition process at 620 C. Polysilicon layer 50 can have a thickness in the range of 500 to 1000 Å and preferably a thickness approximately of 550 Å. The polysilicon layer 50 is implanted with As or Phosphorus ions with a dosage in the range of 1E13 to 1E15 atoms/cm$^2$ and at an implant energy in the range of 30 to 80 Kev. Polysilicon layer 50 has a n-type concentration in the range of 1E10 to 1E21 atoms/cm$^3$.

Figure 8:
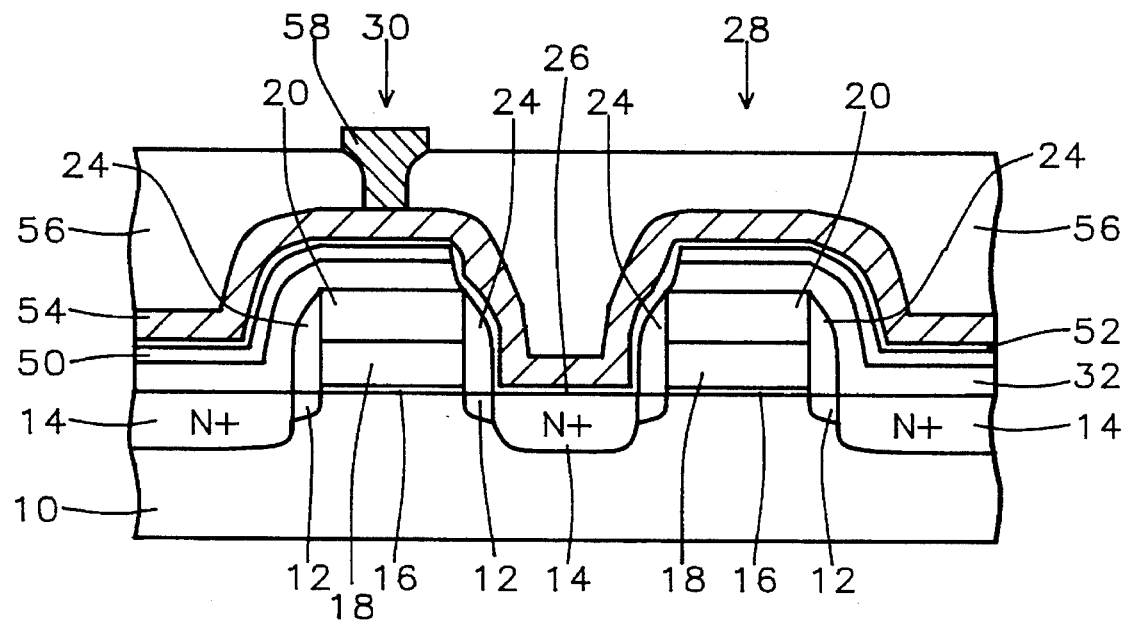

As shown in FIG. 7, portions of the inter-poly oxide layer 32 and polysilicon layer 50 are etched away in the contact area 26 and over the side wall spacers 24. Following this, a barrier layer 52 is formed over the device surface as illustrated in FIG. 8. Barrier layer 52 can be formed of amorphous silicon or polysilicon, preferably of polycrystalline silicon. Barrier layer 52 can be formed by a conventional LPCVD process. Barrier layer 52 can have a thickness in the range of 30 to 100 Å and more preferably a thickness of approximately 50 to 100 Å. Barrier layer 52 is doped by the interdiffusion from the buried N+ source regions during subsequent thermal cycles.

A first metal layer 54 (also called the metal contact layer 54) is formed over the barrier layer 52. Metal layer 54 is preferably formed of tungsten silicide (WSi$_x$). Tungsten metal layer 54 can be formed by a convention LPCVD process. Tungsten layer 54 can have a thickness in the range of 700 to 3000 Å and more preferably a thickness of approximately 1000 Å. Tungsten silicide layer 54 has a resistivity in the range of 4 to 20 ohms/square.

Figure 9:
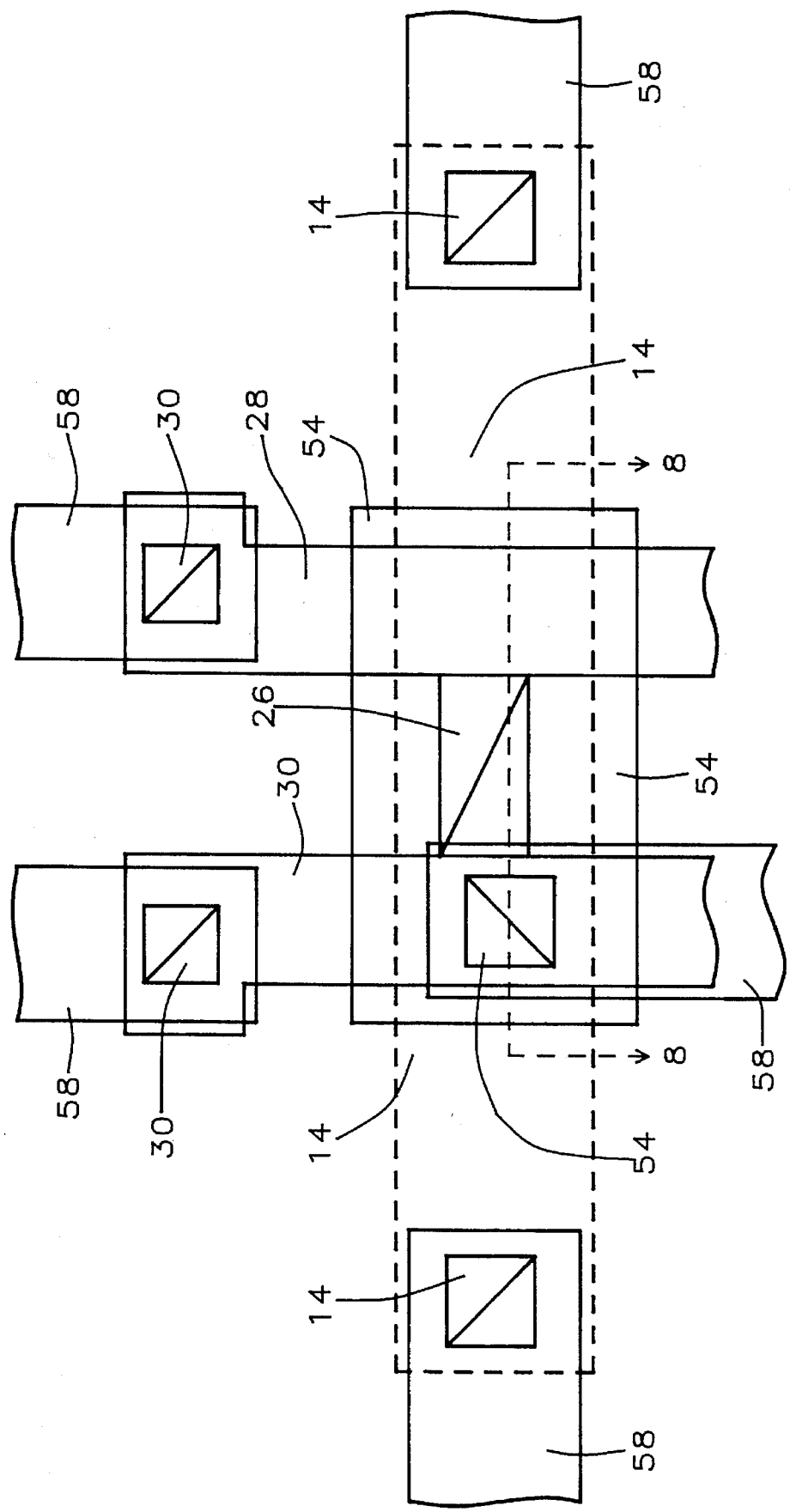
FIG. 9 shows a top down view of the device of the present invention for forming a self aligned metal contact.

As shown in FIGS. 8 and 9, the tungsten silicide (WSi$_x$)layer 54 is patterned using conventional lithography and etching processes. Passivation layer(s) 56 and metal layer(s) 58 are formed to connect the semiconductor elements into an integrated circuit. FIG. 9 shows a top view of the completed devices of FIG. 8. The first metal layer 54, the metal layer 58 and the source/drains 14 form the electrical interconnections to adjacent devices to form logic or memory device.

The process of the present invention has the several advantages over the conventional process. First, the instant process maintains shallow source/drain junctions. The barrier layer 52 formed between the doped polysilicon layer 50 and the source/drains prevents impurities from the doped polysilicon layer 50 from diffusing into the source and drains 14. Since the barrier layer prevents the N-type impurity diffusion into the source/drains 14, the shallow source/drain junction are maintained.

The barrier layer 52 also enhances the step coverage of the first metal layer 54 in the contact area because the barrier layer 52 allows better silicidation due to the reaction of the WSi$_x$ and the barrier layer. The barrier layer 52 provides a preferred metal grain growing surface. Moreover, the barrier layer 52 prevents peeling of the WSi$_x$ at the oxide sidewall spacers 24. The adhesion between the first metal layer 54 (tungsten silicide) and the barrier layer 52 (polysilicon) is much better that the adhesion between WSi$_x$ and oxide in the conventional process.

In addition, the process of the present invention reduces the contact resistance by increasing the area where the first metal contact the substrate in the contact area. The barrier layer 32 of the present invention is much thinner than the inter poly layer of the conventional process. The reduced thickness barrier layer allows more of the first metal layer into the contact area 26. This reduces the contact resistance which increases device performance and yields.

Moreover, the thin barrier will prevent the side wall oxide from being etched in the vapor clean process before the tungsten silicide deposition in the conventional deposition sequence. HF from the vapor clean process will etch the oxide quickly in the vapor clean process. Excessive sidewall oxide loss will reduce the short of the metal contact to the polysilicon gate.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated-circuit device which includes a self aligned contact area between two gate structures on a semiconductor substrate; the substrate containing buried impurity layers; each gate structure comprising a first gate oxide, a gate formed on the gate oxide, a top oxide formed on the gate, sidewall spacers formed on sidewalls of the gate oxide, said gate, and said top oxide; the method comprising:

forming inter-poly oxide layer on said substrate and said gate structures;

forming a polysilicon layer over said inter-poly oxide layer;

implanting impurity ions into said polysilicon layer;

removing portions of said inter-poly oxide layer and said polysilicon layer in the contact area between the gate structures to expose said contact area;

depositing a barrier layer over said polysilicon layer, said sidewall spacers and said contact area;

depositing a first metal layer silicide over the barrier layer thereby forming an electrical connection between the first metal layer silicide and the substrate in said contact area; and forming a dielectric layers and metal layers over said first metal layer silicide and forming interconnections to said first metal layer silicide and said buried impurity layers in said contact area to complete the integrated circuit device.

2. The method of claim 1 wherein the inter-poly oxide layer has a thickness in the range of 700 to 2000 Å.

3. The method of claim 1 wherein the barrier layer has a thickness in the range of 30 to 100 Å.

4. The method of claim 1 wherein the polysilicon layer has a thickness in the range of 500 to 1000 Å.

5. The method of claim 1 wherein the polysilicon layer is implanted with said impurity ions of phosphorous with a dose in the range of 1E13 to 1E15 atoms/cm$^2$.

6. The method of claim 1 wherein the polysilicon layer has a impurity concentration in the range of 1E18 to 1E20 atoms/cm$^3$.

7. The method of claim 1 wherein said first metal layer silicide is a tungsten silicide layer having a thickness in the range of 700 to 3000 Å.

8. The method of claim 1 wherein the sidewall spacers are formed of silicon oxide.

9. A method of making an integrated-circuit device which includes a self aligned contact to a semiconductor substrate in a contact area between two gate structures on said substrate; the gate structures having sidewalls spacers; the method comprising:

forming inter-poly oxide layer on said substrate and said gate structures;

forming a polysilicon layer over said inter-poly oxide layer;

removing portions of the inter-poly oxide layer and said polysilicon layer to expose said sidewall spacers of the gate structures and to expose said contact area;

depositing a barrier layer over said polysilicon layer, said sidewall spacers of the gate structures and said contact area;

depositing a first metal layer over the barrier layer thereby forming an electrical connection between the first metal layer and the substrate in said contact area; and forming dielectric layers and metal layers over said first metal layer and forming interconnections to said first metal layer to complete the integrated circuit device.

10. The method of claim 9 wherein the substrate contains buried impurity layers.

11. The method of claim 9 said gate structures comprise a first gate oxide, a polysilicon gate formed on the gate oxide, and top oxide formed on the polysilicon gate.

12. The method of claim 9 said sidewall spacers are formed of silicon oxide.

13. The method of claim 9 wherein after the polysilicon layer is formed, implanting impurity ions into the polysilicon layer; the impurity ions selected from the group consisting of Arsenic and Phosphorous, with a dosage in the range of 1E13 to 1E15 atoms/cm$^2$ and an energy in the range of 30 to 80 Kev.

14. The method of claim 9 wherein the polysilicon layer has an impurity concentration in the range of 1E18 to 1E21 atoms/cm$^3$.

15. The method of claim 9 wherein the first metal layer is formed of tungsten silicide.

16. The method of claim 9 wherein the inter-poly oxide layer has a thickness in the range of 700 to 2000 Å.

17. The method of claim 9 wherein the barrier layer has a thickness in the range of 30 to 100 Å.

18. The method of claim 9 wherein the polysilicon layer has a thickness in the range of 500 to 1000 Å.

19. The method of claim 9 wherein the polysilicon layer is implanted with impurity ions of phosphorous with a dose in the range of 1E13 to 1E15 atoms/cm$^2$.

20. The method of claim 9 wherein the polysilicon layer has a impurity concentration in the range of 1E18 to 1E20 atoms/cm$^3$.

21. The method of claim 9 wherein the tungsten silicide layer has a thickness in the range of 700 to 3000 Å.

* * * * *